(12) United States Patent
Hosseini et al.

(10) Patent No.: US 9,165,792 B2
(45) Date of Patent: Oct. 20, 2015

(54) INTEGRATED CIRCUIT, A CHIP PACKAGE AND A METHOD FOR MANUFACTURING AN INTEGRATED CIRCUIT

(71) Applicant: Infineon Technologies AG, Neubiberg (DE)

(72) Inventors: Khalil Hosseini, Weihmichl (DE); Joachim Mahler, Regensburg (DE); Anton Mauder, Kolbermoor (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 272 days.

(21) Appl. No.: 13/625,893

(22) Filed: Sep. 25, 2012

(65) Prior Publication Data

US 2014/0084302 A1  Mar. 27, 2014

(51) Int. Cl.
*H01L 23/48* (2006.01)
*H01L 21/50* (2006.01)
(Continued)

(52) U.S. Cl.
CPC ............ *H01L 21/50* (2013.01); *H01L 21/6835* (2013.01); *H01L 21/76898* (2013.01); *H01L 23/3171* (2013.01); *H01L 24/13* (2013.01); *H01L 24/92* (2013.01); *H01L 24/94* (2013.01); *H01L 24/03* (2013.01); *H01L 24/05* (2013.01); *H01L 24/08* (2013.01); *H01L 24/11* (2013.01); *H01L 24/16* (2013.01); *H01L 24/27* (2013.01); *H01L 24/29* (2013.01); *H01L 24/32* (2013.01); *H01L 24/80* (2013.01); *H01L 24/83* (2013.01); *H01L 2221/6834* (2013.01); *H01L 2221/68327* (2013.01); *H01L 2221/68377* (2013.01); *H01L 2224/03462* (2013.01); *H01L 2224/03912* (2013.01); *H01L 2224/0401* (2013.01); *H01L 2224/05009* (2013.01); *H01L 2224/0566* (2013.01); *H01L 2224/05611* (2013.01); *H01L 2224/05618* (2013.01); *H01L 2224/05624* (2013.01); *H01L 2224/05639* (2013.01);
(Continued)

(58) Field of Classification Search
CPC . H01L 23/3171; H01L 21/50; H01L 21/6835; H01L 21/768; H01L 21/58; H01L 2221/68327; H01L 2221/6834; H01L 2924/0002; H01L 2924/00
USPC .............. 257/76, 77, 762, 750, 774, E29.089, 257/E29.082, 753, 765; 438/455, 459, 667, 438/652, 118, 628
See application file for complete search history.

(56) References Cited

U.S. PATENT DOCUMENTS 6,911,392 B2 *  6/2005  Bieck et al. ................... 438/667
7,626,258 B2 * 12/2009  Lim et al. ...................... 257/704
(Continued)

FOREIGN PATENT DOCUMENTS

DE            10225373 A1      4/2003

*Primary Examiner* — Thinh T Nguyen

(57) ABSTRACT

An integrated circuit is provided, the integrated circuit including: a carrier including at least one electronic component and at least one contact area disposed on a first side of the carrier, wherein the at least one electronic component is electrically connected to the at least one contact area; an inorganic material layer wafer bonded to the first side of the carrier, wherein the carrier has a first coefficient of thermal expansion, and wherein the inorganic material layer has a second coefficient of thermal expansion, wherein the second coefficient of thermal expansion has a difference of less than 100% compared with the first coefficient of thermal expansion; and at least one contact via formed through the inorganic material layer, wherein the at least one contact via contacts the at least one contact area.

19 Claims, 6 Drawing Sheets

(51) Int. Cl.
*H01L 23/31* (2006.01)
*H01L 21/683* (2006.01)
*H01L 21/768* (2006.01)
*H01L 23/00* (2006.01)

(52) U.S. Cl.
CPC .......... *H01L2224/05644* (2013.01); *H01L 2224/05647* (2013.01); *H01L 2224/05655* (2013.01); *H01L 2224/05664* (2013.01); *H01L 2224/08145* (2013.01); *H01L 2224/11462* (2013.01); *H01L 2224/131* (2013.01); *H01L 2224/13009* (2013.01); *H01L 2224/1316* (2013.01); *H01L 2224/13111* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16227* (2013.01); *H01L 2224/27416* (2013.01); *H01L 2224/2919* (2013.01); *H01L 2224/29124* (2013.01); *H01L 2224/29144* (2013.01); *H01L 2224/29188* (2013.01); *H01L 2224/32145* (2013.01); *H01L 2224/80203* (2013.01); *H01L 2224/80801* (2013.01); *H01L 2224/80893* (2013.01); *H01L 2224/80894* (2013.01); *H01L 2224/8385* (2013.01); *H01L 2224/83805* (2013.01); *H01L 2224/9202* (2013.01); *H01L 2224/94* (2013.01); *H01L 2924/01322* (2013.01); *H01L 2924/12032* (2013.01); *H01L 2924/1301* (2013.01); *H01L 2924/1305* (2013.01); *H01L 2924/1306* (2013.01); *H01L 2924/13034* (2013.01); *H01L 2924/13091* (2013.01)

(56) References Cited

U.S. PATENT DOCUMENTS

| | | | | |
|---|---|---|---|---|
| 7,723,207 | B2 * | 5/2010 | Alam et al. | 438/455 |
| 2008/0042140 | A1 * | 2/2008 | Alam et al. | 257/74 |
| 2008/0067664 | A1 * | 3/2008 | Lim et al. | 257/690 |
| 2012/0292757 | A1 | 11/2012 | Mauder et al. | |

* cited by examiner

FIG 1

~ 100 wafer bonding an inorganic material layer to a first side of a carrier, the carrier including at least one electronic component and at least one contact area disposed on a first side of the carrier, wherein the at least one electronic component is electrically connected to the at least one contact area; and ~ 110 forming at least one contact via through the inorganic material layer, wherein the at least one contact via contacts the at least one contact area. ~ 120

INTEGRATED CIRCUIT, A CHIP PACKAGE AND A METHOD FOR MANUFACTURING AN INTEGRATED CIRCUIT

TECHNICAL FIELD

Various embodiments relate generally to an integrated circuit, a chip package and a method for manufacturing an integrated circuit.

BACKGROUND

Power semiconductor components may be formed or fabricated in a semiconductor wafer using known processes. In part of these processes, the semiconductor components may be encapsulated with organic polymer material, mold compound or laminate, which may be deposited over or on the surfaces of the semiconductor wafer, thereby covering surfaces of the power semiconductor components. Encapsulation with polymer materials may lead to a high moisture absorption and to a coefficient of thermal expansion (CTE) which may not be adjusted to the semiconductor components. That is, CTE mismatch between currently-used encapsulation materials and the power semiconductor components may lead to reliability issues. Organic polymer materials may also suffer from low thermal conductivity even if they do not contain inorganic filler particles.

SUMMARY

Various embodiments provide an integrated circuit including: a carrier including at least one electronic component and at least one contact area disposed on a first side of the carrier, wherein the at least one electronic component is electrically connected to the at least one contact area; an inorganic material layer wafer bonded to the first side of the carrier, wherein the carrier has a first coefficient of thermal expansion, and wherein the inorganic material layer has a second coefficient of thermal expansion, wherein the second coefficient of thermal expansion has a difference of less than 100% compared with the first coefficient of thermal expansion; and at least one contact via formed through the inorganic material layer, wherein the at least one contact via contacts the at least one contact area.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for manufacturing an integrated circuit according to an embodiment;

FIGS. 3A and 3B 2A show part of a method for manufacturing an integrated circuit according to various embodiments.

DESCRIPTION

Figure 2A:
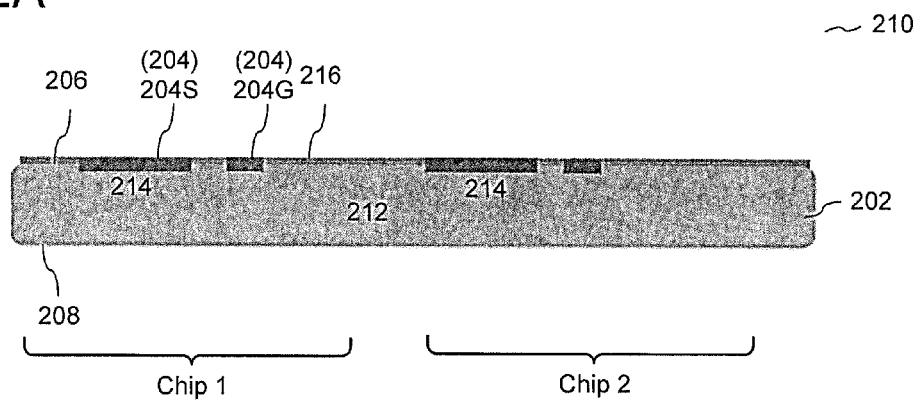
FIGS. 2A to 2I show a method for manufacturing an integrated circuit according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" may also be used herein to mean that the deposited material may be formed "indirectly on" the implied side or surface with one or more additional layers being arranged between the implied side or surface and the deposited material.

Currently, known methods for chip encapsulation still suffer from reliability issues, due to CTE mismatch and moisture absorption brought on by the limitation of currently-used encapsulation materials. In addition to providing a surrounding structure for semiconductor components, encapsulation materials also need to electrically insulate electrical interconnects which may be connected to the semiconductor components.

Encapsulation materials have be known to be used as a cover material, which may be bonded onto a semiconductor wafer. The cover material may be manufactured from glass or a lead frame material, and if necessary may even be provided with conducting materials. It may also be possible that the encapsulation materials may include inorganic or organic materials, which may be used for electrical passivation and insulation, and may provide a hermetic seal. Electrical wiring or rewiring may generally be formed on the surface of the semiconductor wafer, in the regions underneath the cover material.

Various embodiments may address issues associated with reliability, such as by improving coefficient of thermal expansion (CTE) mismatch between a semiconductor component and a housing encapsulation material. Various embodiments may provide a encapsulation material as a housing material for a semiconductor component, wherein the encapsulation material may be an inorganic material. The inorganic material may reduce or eliminated moisture absorption and may reduce CTE mismatch between the encapsulation material, the active electrical components and the semiconductor wafer in which the active electrical components may be formed. The housing encapsulation material may be a wafer carrier, e.g. a silicon wafer, which may provide structural support for the thinning of a back side of the wafer of the semiconductor component. The housing encapsulation may, in addition to covering or at least partially surround active electrical components of the semiconductor wafer, also provide a means for forming contacting vias through the housing encapsulation material for contacting the semiconductor component.

FIG. 1 shows method 100 for manufacturing an integrated circuit according to an embodiment. Method 100 may include:

wafer bonding an inorganic material layer to a first side of a carrier, the carrier including at least one electronic component and at least one contact area disposed on a first side of the carrier, wherein the at least one electronic component is electrically connected to the at least one contact area (in 110); and forming at least one contact via through the inorganic material layer, wherein the at least one contact via contacts at least one contact area (in 120).

FIGS. 2A to 2I show various schematic cross sectional views of processing stages in a method for manufacturing an integrated circuit according to an embodiment.

FIG. 2A, in view 210 shows carrier 202 according to an embodiment. Carrier 202 may include a semiconductor wafer, e.g. a semiconductor wafer substrate. According to various embodiments, carrier 202 may include at least one of: silicon (Si), e.g. doped or undoped silicon; germanium (Ge); gallium arsenide (GaAs); indium phosphide (InP); gallium nitride (GaN); silicon carbide (SiC); and indium gallium arsenide (InGaAs).

View 210 shows carrier 202 including one or more electrical components 214 formed in carrier 202. These electrical components 214 may typically have been manufactured during semiconductor front end processes, wherein electrically active regions of the one or more electrical components may be formed in carrier 202.

The active circuit regions may generally be formed at the top side of carrier 202, e.g. at first chip side 206 and may include different regions with different conductivity, doping type, doping concentration and size. These active circuit regions may include, for example source regions and/or gate regions and/or channel regions.

As an example, for illustration of an underlying principle according to various embodiments, an electrical component 214 may be a single vertical field effect transistor, e.g. a power metal oxide semiconductor field-effect transistor (MOSFET), which may include source/drain regions, a body region and insulated gate, which are not shown in the figures, but may be referred to collectively as electrical component 214. Carrier 202 may include at least one contact area 204, e.g. contact pads, which may be formed over or on first chip side 206. Contact area(s) 204 may be formed over the active circuit regions and be in electrical contact with the active circuit regions of the electrical components 214. Contact area(s) 204 may be referred to as a contact pad(s) or front side electrode(s). Carrier 202 may include front side electrodes, as an example, a source electrode 204S and a gate electrode 204G. Source electrode 204S may be disposed over and may be in electrical connection with a source region of the electrical component. Gate electrode 204G may disposed over a gate insulation layer and may be electrically insulated from a body region of the electrical component. In a power MOSFET, and in power devices in general, electrical current may flow vertically in the power transistors, for example between first chip side 206 and second chip side 208. Current, e.g. electrons, may flow between contact area(s) 204 disposed over or directly on first chip side 206 and further contact area(s) (not shown) which may be disposed over or directly on second chip side 208. As an example, Current, e.g. electrons, may flow between source electrode 204S and a drain electrode 204D (not shown). Drain electrode 204D formed in subsequent processing stages may be disposed over a drain region, which may be formed in or may be part of substrate region 212 of carrier 202. Drain electrode 204D may be referred to as a back side metallization and may be formed in subsequent processing stages, e.g. after thinning of carrier 202 from second chip side 208 until a suitable thickness is obtained.

As may be understood, the principles described above may apply to other integrated circuits or vertical and/or lateral electrical components. According to various other embodiments, electrical component 214 may include at least one of: a power bipolar transistor, a power field effect transistor, a power insulated gate bipolar transistor, a thyristor, a MOS controlled thyristors, a silicon controlled rectifier, a power schottky diode, a silicon carbide diode, and a gallium nitride device.

It may be understood that carrier 202 may include or be a semiconductor wafer ranging in size. As an example, carrier 202 may have a diameter ranging from about 25 mm to about 500 mm, e.g. from about 100 mm to about 500 mm, e.g. about 200 mm to about 400 mm. It may be understood however, that carrier 202 may not be limited to these sizes, and the principles described in this description may apply to carriers of other sizes outside these described ranges.

View 210 shows carrier 202, which may include two neighboring electrical components 214. It may be understood that a plurality of electrical components 214, e.g. up to two, or three, or four, or even tens, hundreds or thousands of electrical components, may be formed in a single semiconductor wafer, i.e. carrier 202. As an example, according to various embodiments, carrier 202 may include a plurality of chips or dies, each chip or die including at least one electrical component. For the sake of simplicity, the neighboring electrical components 214 shown in view 210 may be illustratively shown as belonging to separate chips, e.g. chip 1 and chip 2. That is, chip 1 may be separated or individualized from chip 2 in subsequent chip dicing processes. It may be understood however, that depending on how dicing lines are drawn or determined, each individualized chip may include more than one electrical component 214. As an example, both neighboring electrical components 214 may be part of a single chip after chip dicing, according to other embodiments.

It may be understood that the processes described herein and hereinafter may be applied to a single chip or at wafer level, that is in parallel and simultaneously to a plurality of chips formed in a single wafer.

As shown in view 210, carrier 202 may include dielectric layer 216 formed over first side 206 of carrier 202. It may be possible that a plurality of dielectrical layer(s) 216 may be formed over first side 206, however for the sake of simplicity, only a single dielectric layer 216 is shown in the figures. Generally, dielectric layer 216 may be formed in areas between contact area(s) 204, as an example, between neighboring source electrode(s) 204S and gate electrode(s) 204G, and may be used to separate and electrically isolate the electrically conductive source electrode(s) 204S and gate electrode(s) 204G from each other. Dielectric layer 216 may include or consist of silicon oxide, e.g. Phosphosilicate glass (PSG) and/or Boro-phosphosilicate glass (BPSG), which may be deposited using deposition techniques, such as at least one of chemical vapor deposition (CVD), sputtering, high-density plasma, or thermal oxidation. Dielectric layer 216 may be formed as part of interdielectric metallization levels formed over first side 206 of carrier 202.

Figure 2B:
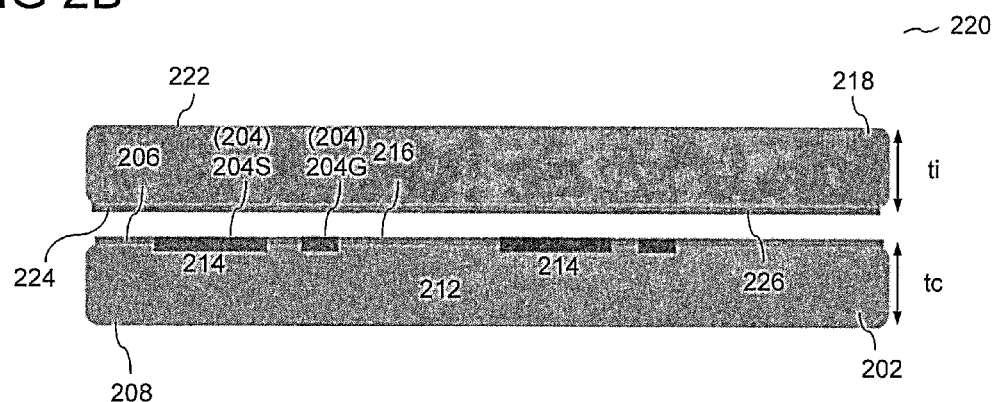
Figure 2C:
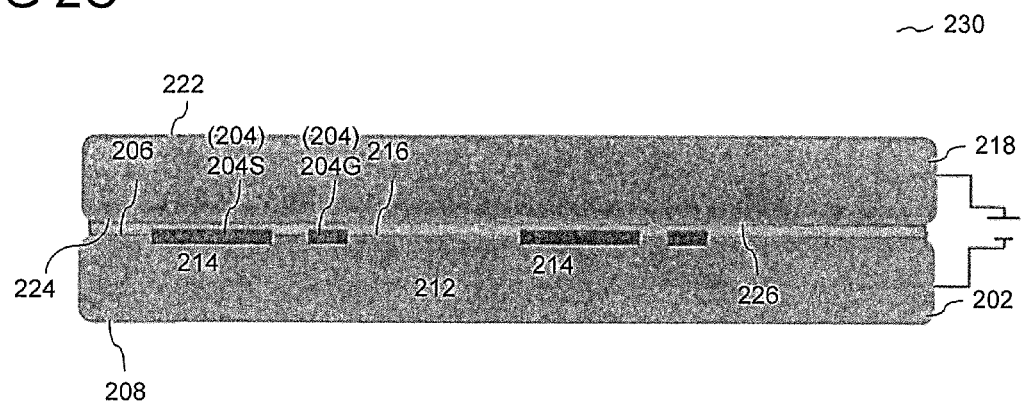
Figure 2D:
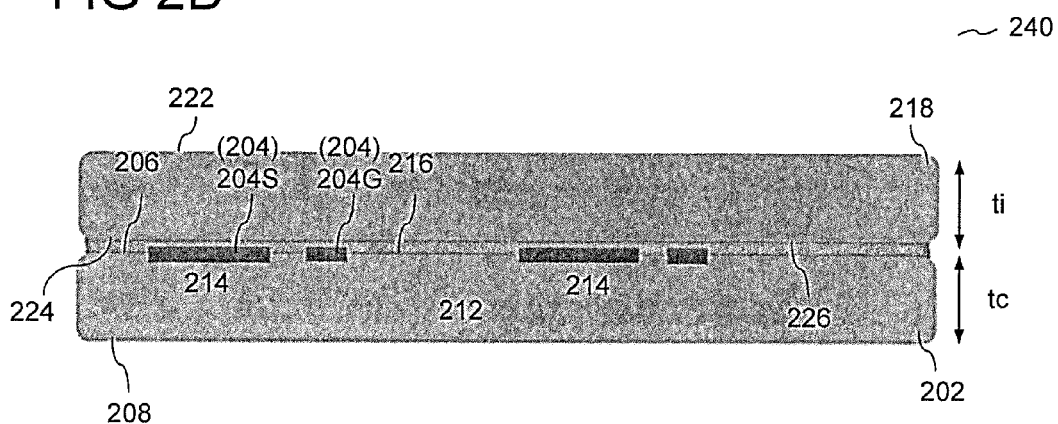

FIGS. 2B to 2D, in views 220 to 240, show how inorganic material layer 218 may be wafer bonded to first side 206 of carrier 202.

Inorganic material layer 218 may include a wafer including or consisting of inorganic material. According to some embodiments, inorganic material layer 218 may include silicon. As an example, inorganic material layer 218 may include a silicon wafer, e.g. an undoped silicon wafer. According to other embodiments, Inorganic material layer 218 may include at least one material from the following group of materials, the group of materials consisting of: silicon (Si), gallium arsenide (GaAs), indium phosphide (InP), gallium nitride (GaN), glass, aluminum oxide ($Al_2O_3$) and silicon carbide (SiC).

Carrier 202 may have a thickness, tc, ranging from about 250 µm to about 900 µm, e.g. about 300 µm to about 600 µm. According to some embodiments, inorganic material layer 218 may have a thickness, ti, ranging from about 250 µm to about 900 µm, e.g. about 300 µm to about 600 µm. It may however be understood that carrier 202 and inorganic material 218 are not limited to having these thickness and may also include other thicknesses not in the above ranges.

Inorganic material layer 218 may have top side 222 and bottom side 224, bottom side 224 facing a direction opposite to top side 222. Inorganic material layer 218 may include further dielectric layer 226 formed over bottom side 224. Further dielectric layer 226 may include or consist of silicon oxide, e.g. Phosphosilicate glass (PSG) and/or Boro-phosphosilicate glass (BPSG). Further dielectric layer 226 may include or be formed from the same material as dielectric layer 216.

As shown in view 230 of FIG. 2C, carrier 202 and inorganic material layer 218 may be brought together. First chip side 206 of carrier 202 may be joined to bottom side 224 of inorganic material layer 218. First chip side 206 and bottom side 224 may be joined together via dielectric layer 216 and further dielectric layer 226.

Inorganic material layer 218 may be wafer bonded to first side 206 of carrier 202, e.g. by directly bonding inorganic material layer 218 to first side 206 of carrier 202. Anodic bonding, as an example, is shown in FIG. 2C. In anodic bonding, the active silicon wafer, e.g. carrier 202 may be joined directly to inorganic material layer 218 via silicon dioxide dielectric layer and further dielectric layers 216, 226, without additional intermediate adhesives or glues. It may be understood that according to other embodiments, other methods for wafer bonding carrier 202 to inorganic material layer 218 may be carried out. These methods may include at least one of fusion bonding, thermocompression bonding and reactive bonding.

According to other embodiments, it may also be possible to wafer bond carrier 202 to inorganic material 218 using an intermediate layer 248 between carrier 202 and inorganic material 218. Such methods for indirect bonding may include eutectic bonding, glass frit bonding and adhesive bonding.

Figure 3A:
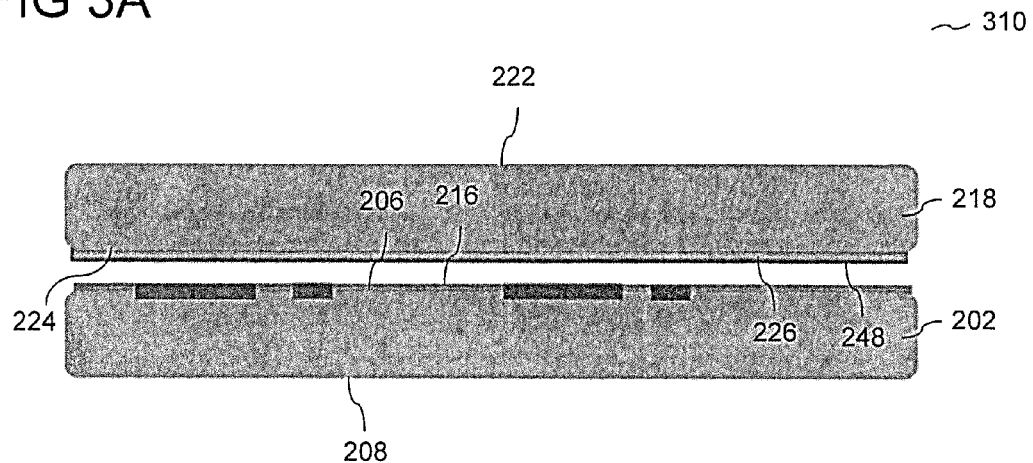
Figure 3B:
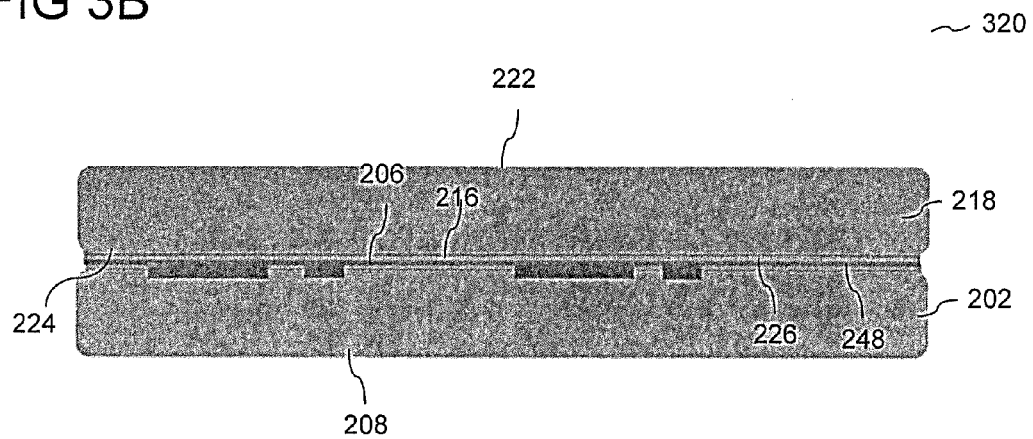

As an example, shown in FIGS. 3A and 3B, indirect bonding may be carried out as shown in cross-sectional views 310 and 320. Intermediate layer 248 may be deposited over or directly on further dielectric layer 226, e.g. over bottom side 224 of inorganic material layer 218 as shown in view 310. As an example, for an adhesive bonding process, intermediate layer 248 may include a glue or adhesive paste 248, which may be deposited, e.g. spin-coated uniformly, onto further dielectric layer 226. Through the application of heat and pressure which presses inorganic material layer 218 and carrier 202 together, inorganic material layer 218 and carrier 202 may be sealed together. According to other embodiments, such as wherein eutectic bonding may be applied for the joining of inorganic material layer 218 to carrier 202, intermediate layer 248 may include a metal or metal alloy, e.g. including gold (Au) or aluminum (Al). According to other embodiments, such as glass frit bonding, intermediate layer 248 may include a glass frit.

As shown in views 240 and 320, inorganic material layer 218 carrier 202 may be hermetically sealed and/or joined to inorganic material layer 218. In view 240, carrier 202 and inorganic material layer 218 are shown to be joined directly to each other. In view 320, carrier 202 and inorganic material layer 218 are shown to be joined to each other via intermediate layer 248.

It may be understood that carrier 202 may have a first coefficient of thermal expansion (CTE1) and inorganic material layer 218 may have a second coefficient of thermal expansion (CTE2).

Typical CTE values for the materials of carrier 202 and inorganic material layer 218 may be as follows:

Silicon may have a CTE of about $2.8 \times 10^{-6}$/K;
Gallium Arsenide may have a CTE of about $6.8 \times 10^{-6}$/K;
Indium Phosphide may have a CTE of about $4.75 \times 10^{-6}$/K;
Gallium Nitride may have a CTE of about $5.6 \times 10^{-6}$/K;
Silicon Carbide may have a CTE of about $4.2 \times 10^{-6}$/K.

Carrier 202 and inorganic material layer 218 may be chosen wherein second coefficient of thermal expansion (CTE2) may have a difference of less than 100% compared with first coefficient of thermal expansion (CTE1). In other words, wherein $\|CTE1-CTE2\|/CTE1 \times 100 \leq 100$. Put in another way, the difference between CTE2 and CTE1 may be about equal to or less than the value of CTE 1, in other words, wherein $CTE2-CTE1 \leq CTE1$. It may be understood that according to some embodiments, the difference may refer to the absolute value of the difference between CTE2 and CTE 1.

According to some embodiments, carrier 202 and inorganic material layer 218 may be formed from the same material or materials. For example, carrier 202 and inorganic material layer 218 may have approximately equal CTEs, i.e. CTE1 may be about equal CTE2. As an example, carrier 202 may include a silicon wafer, which may have a CTE of about 2.8 ($\times 10^{-6}$/K), and inorganic material layer 218 may include a silicon wafer, which may have a CTE of about 2.8 ($\times 10^{-6}$/K). According to some embodiments, carrier 202 and inorganic material layer 218 may be selected wherein CTE2 may have a difference of less than 100% compared with CTE1. As an example, carrier 202 may include a silicon wafer, which may have a CTE of about 2.8 ($\times 10^{-6}$/K) and inorganic material layer 218 may include a silicon carbide wafer, which may have a CTE of about 4.2 ($\times 10^{-6}$/K). According to some embodiments, carrier 202 and inorganic material layer 218 may be selected wherein CTE2 may have a difference of about 100% compared with CTE1. As an example, carrier 202 may include a silicon wafer, which may have a CTE of about 2.8 ($\times 10^{-6}$/K). Inorganic material layer 218 may include a gallium nitride wafer, which may have a CTE of about 5.6 ($\times 10^{-6}$/K).

In addition to the possible materials mentioned above for inorganic material 218, inorganic material layer 218 may include aluminum oxide or glasses according to other embodiments. As an example, aluminum oxide may have a CTE of about $6 \times 10^{-6}$/K to about $8 \times 10^{-6}$/K. Glasses such as boroxilicate glass may have a CTE of about $3.0 \times 10^{-6}$/K. Quartz glass may have a CTE of about $0.5 \times 10^{-6}$/K. Soda-lime glass may have a CTE of about $7.6 \times 10^{-6}$/K.

As an example, carrier 202 may include a silicon carbide wafer, which may have a CTE of about 4.2 ($\times 10^{-6}$/K) and inorganic material layer 218 may include borosilicate glass, which may have a CTE of about 3 ($\times 10^{-6}$/K).

Figure 2E:
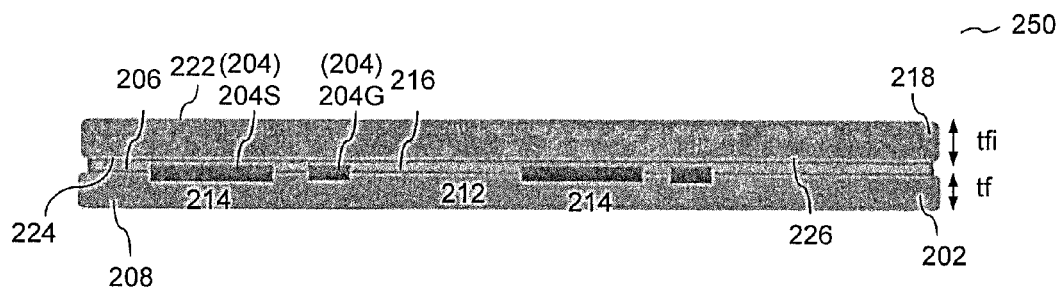

FIG. 2E, in view 250, shows the back side thinning of the active wafer, carrier 202. Carrier 202 may be thinned from second chip side 208 of carrier 202 until the required final thickness, tf, is obtained. According to some embodiments, the required final thickness, tf, may be about 100 μm. According to some embodiments, the required final thickness, tf, may be less than about 100 μm; as an example, ranging from about 50 μm to about 100 μm. During the thinning, inorganic material layer 218 may be a carrier or supporting holder of carrier 202, and even after carrier 202 is thinned. According to some embodiments, subsequently, inorganic material layer 218 may also be thinned, e.g. from top side 222 or inorganic material layer 218, until a required final thickness tfi is obtained. The final thickness of inorganic material layer 218 may be about 100 μm, or less than about 100 μm; as an example, ranging from about 50 μm to about 100 um. It may be understood that the ranges given only serve as examples, and that other final thicknesses outside of these ranges may also be possible, according to other embodiments.

Figure 2F:
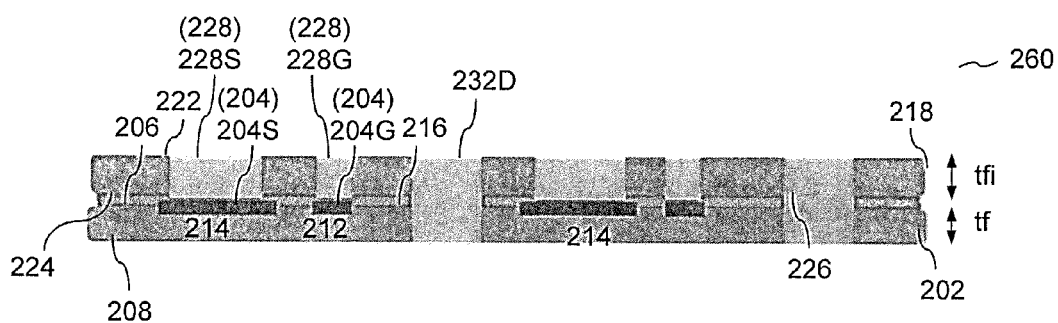

FIG. 2F shows in view 260 the wafer-bonded structure after wafer bonding and/or thinning. As shown in view 260, at least one portion of inorganic material layer may be selectively removed to form hole(s) or channel(s) 228 over contact area(s) 204. Channel(s) 228 may be formed through inorganic material layer 218, and may be formed through the selective removal of portions of inorganic material layer 218. Channel(s) 228 may extend from top side 222 of inorganic material layer 218 down to contact area(s) 204 formed on first chip side 206 of carrier 202. As an example, by selective removal of portions of inorganic material layer 218, source electrode 204S and gate electrode 204G may be exposed. As an example, channel 228S may be formed over source electrode 204S, thereby exposing source electrode 204S due to the removal of a portion of inorganic material layer 218 covering source electrode 204s. As another example, channel 228G may be formed over gate electrode 204G, thereby exposing gate electrode 204G due to the removal of a further portion of inorganic material layer 218 covering gate electrode 204G.

In a parallel or subsequent process, through-hole or through-channel 232D may be formed through both carrier 202 and inorganic material layer 218, and additionally through dielectric layer 216 and further dielectric layer 226. Through-channel 232D may extend from top side 222 of inorganic material layer 218 to second chip side 208 of carrier 202. According to some embodiments, the selective removal of portion(s) of inorganic material layer 218 may be carried out by etching, e.g. through a Bosch process. According to other embodiments, the selective removal of portion(s) of inorganic material layer 218 may be carried out by a mechanical removal process, e.g. by drilling or laser drilling.

Figure 2G:
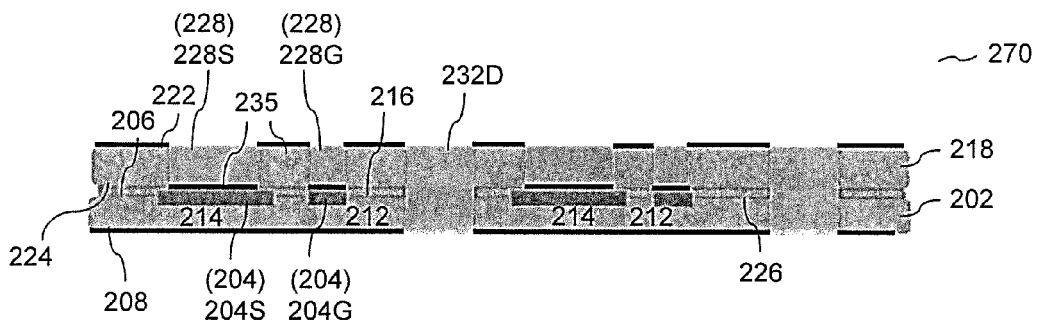

FIG. 2G shows, in view 270, the deposition of metallic seed layer 235 over contact area(s) 204 and over front side 222 of inorganic material layer 218 and second chip side 208 of carrier 202. Metallic seed layer 235 may have a thickness ranging from about 50 nm to about 140 nm, e.g. about 75 to about 110 nm. Metallic seed layer 236 may include at least one material, element or alloy from the following group of materials, the group consisting of: copper, aluminum, silver, tin, gold, palladium, zinc, nickel, iron. It may be understood that metallic seed layer 235 may be patterned or structured in preparation for galvanic deposition or electroplating of electrically conductive material 234 onto metallic seed layer 235.

Figure 2H:
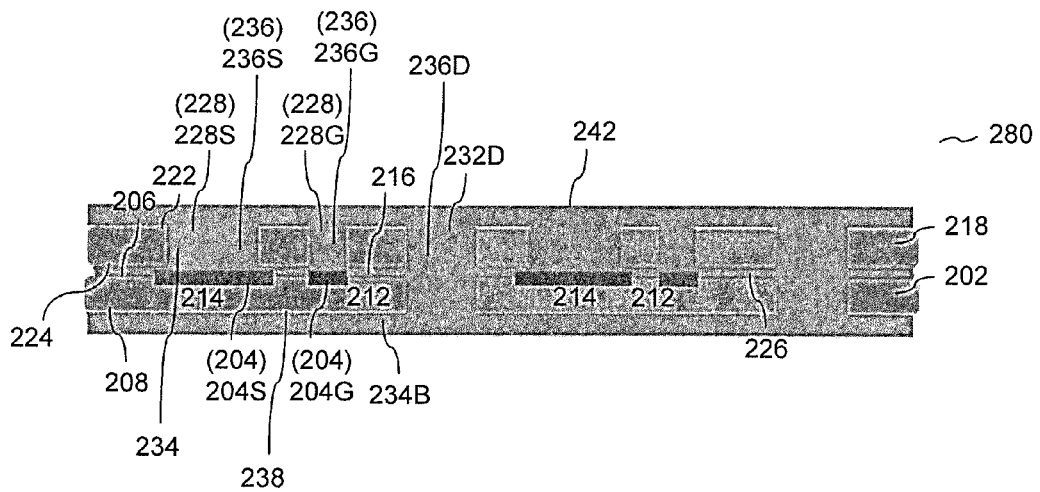

FIG. 2H in view 280 shows the deposition of electrically conductive material 234 onto metallic seed layer 235, e.g. by galvanic deposition, e.g. electroplating.

Electrically conductive material 234 may be formed over seed layer 235 and over front side 222 and second chip side 208. Electrically conductive material 234 may be formed in channel(s) 228, e.g. 228S, 228G and channel 232D, and may at least partially fill or substantially fill the channel(s) 228 and 232D. Portion 234B of electrically conductive material 234 may be formed over second chip side 208, e.g. over metallic seed layer 235 disposed over second chip side 208. Portion 234F of electrically conductive material 234 may be formed over front side 222.

The deposition of electrically conductive material 234 in channel(s) 228, 232D, may lead to the formation of electrically conductive via(s) 236 formed in channels 228S 228G and 232D. Electrically conductive via(s) 236, e.g. 236S, 236G may include or consist of electrically conductive material 234. Electrically conductive via(s) 236S, 236G may be formed through or extend through inorganic material layer 218. Electrically conductive via(s) 236S, 236G may be in physical and electrically connection with contact area(s) 204.

As an example, electrically conductive material 234 formed in channel 228S may form contact via 236S, which may extend through inorganic material layer 218. Contact via 236S may be formed over contact area 204S and may be in physical and electrically connection with contact area 204S. Similarly, electrically conductive material 234 formed in channel 228G may form contact via 236G, which may extend through inorganic material layer 218. Contact via 236G may be formed over contact area 204G and may be in physical and electrically connection with contact area 204G.

Electrically conductive material 234 formed in channel 232D may form further contact via 236D, which may extend through inorganic material layer 218, dielectric layer 216, further dielectric layer 226 and carrier 202. Further contact via 236D may be in connection with portion 234B which may be formed over second side 208 of carrier 202. It may be understood that portion 234B may cover at least part of a further contact area 238 formed on a second side 208 of carrier 202. Further contact area 238 may refer generally to a region on second side 208 of carrier 202, wherein a backside metallization or drain electrode 204D (not shown) previously described, may be formed. It may be understood that portion 234B of electrically conductive material 234 may be part of a drain electrode 204D (not shown) or backside metallization formed on second side 208 of carrier, wherein 234B may be electrically coupled to electrical component 214, e.g. to a drain region of electrical component 214 formed in substrate region 212. Further contact via 236D, being electrically connected to 234B may electrically redirect portion 234B from further contact area 238 on second chip side 208 to top side 222.

Electrically conductive material 234 (and contact vias 236S, 236D, 236G) may include at least one material, element or alloy from the following group of materials, the group consisting of: copper, aluminum, silver, tin, gold, palladium, zinc, nickel, iron.

It may be understood that the electroplating process may be carried out to plate electrically conductive material 234 over multiple structured portions of metallic seed layer 235. The plated electrically conductive material 234 may form a common continuous conductive material or layer, substantially seamlessly joined together. As an example, contact via(s) 236 and further contact via 236D may be continuously joined to portions 234F and 234B.

Subsequently, solder material 242 may also be optionally deposited, e.g. by electroplating, over or directly on portion 234F of electrically conductive material 234. In other words over top side 222 of inorganic material layer 218. Solder material 242 may be formed over contact via(s) 236S and/or 236G and/or 236D at top side 222 of inorganic material layer 218.

Figure 2I:
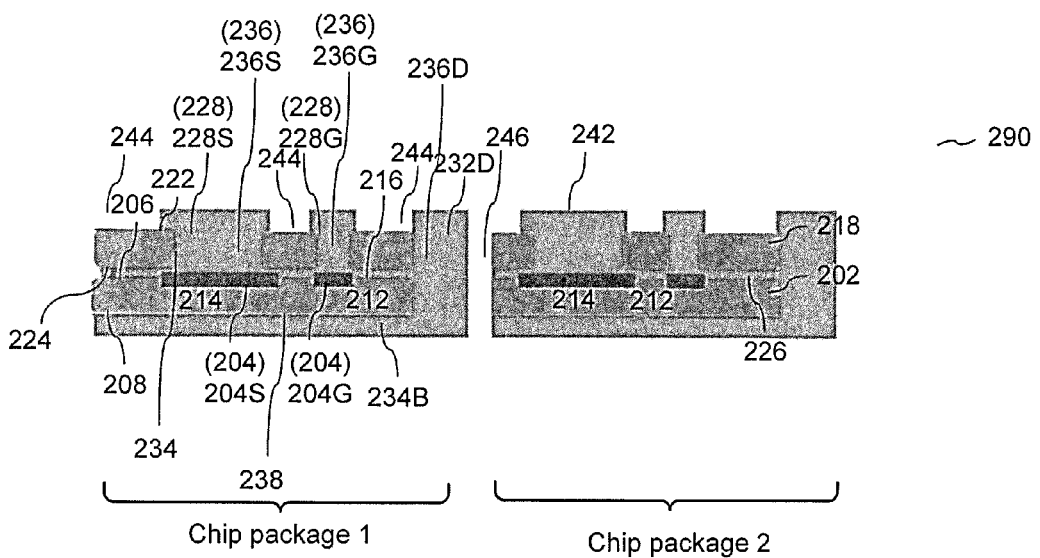

FIG. 2I, in view 290, shows the processes of structuring and subsequently, singulation. Structuring may first be carried out for the separation of metallization contacts for the chips. This may be followed by singulation of the individualized components, such as by carrying out a dicing process.

For structuring and separation of metallization contacts, masking, such as photolithography may be used. One or more holes 244 may be formed, e.g. etched, in electrically conductive material 234, e.g. in portion 234F of electrically conductive material 234. Holes 244 or gaps may separate contact vias 236, 236D from each other. As an example, contact via 236S which may be electrically connected to source electrode 204S may be electrically isolated from contact via 236G which may be electrically connected to gate electrode 204G. In this way, contact metallization vias connected to source electrode 204S and gate electrode 204G may not be short circuited. Furthermore, contact vias 236S and 236G may each also be separated from further contact via 236D by holes 244, and therefore electrically isolated from further contact via 236D which may be electrically connected to further contact area 238 on second chip side 208. Further contact via 236D may be electrically connected to further contact area 238 via portion 234B, which may form or be at least part of a back side metallization formed over further contact area 238, which may be in electrical connection with a drain region of electrical component 214.

In order to separate chip 1 from chip 2, through-hole 246 may be formed, by etching or selectively removing part of further contact via 236D extending from top side 222 of inorganic material layer 218 to second chip side 208 of carrier 202. The formation of through-hole 246 may separate chip package 1 from chip package 2.

Subsequently, an individualized semiconductor component, e.g. chip package 1 and/or chip package 2 may be contacted, e.g. individually to external circuitry, e.g. to a printed circuit board. It may be understood that top side 222 of inorganic material layer 218 may the side of chip package 1 which may be joined to external circuit, e.g. to a printed circuit board. Contact via(s) 236S, 236G, 236D, with or without finishing with solder material 242, may each be soldered or joined to separate pins of the printed circuit board.

Method 200 according to various embodiments, may be carried out to manufacture an integrated circuit or chip package according to various embodiments. Chip package 1, as shown in view 290, which may be manufactured by method 200 may include semiconductor wafer 202, which may include at least one electronic circuit 214 and at least one contact pad 204 formed over a wafer first side 206. Electronic circuit 214 may be electrically connected to contact pad 204. Chip package 1 may include layer 218, which may have a coefficient of thermal expansion difference of less than 100% compared with a coefficient of thermal expansion of semiconductor wafer 202. Layer 218 may be wafer bonded to semiconductor wafer 202 over at least one contact pad 204. Chip package 1 may include at least one electrical interconnect 236 formed through layer 218 and electrically contacting contact pad 204.

Figure 4:
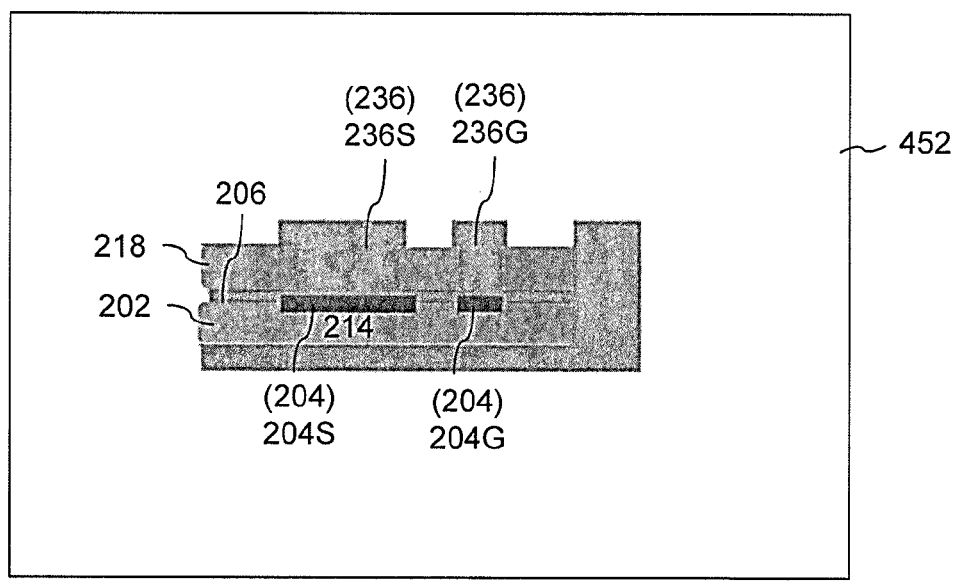
FIG. 4 shows an integrated circuit according to an embodiment.

FIG. 4 shows cross-sectional view 410 of integrated circuit 452 manufactured according to various embodiments. Integrated circuit 452 may include one or more or all of the features already described with respect to chip package 1. Integrated circuit 452 may include: carrier 202 including at least one electronic component 214 and at least one contact area 204 disposed on first side 206 of carrier 202. Electronic component 214 may be electrically connected to contact area 204. Integrated circuit 452 may include inorganic material layer 218 wafer bonded to first side 206 of carrier 202. Carrier 202 may have a first coefficient of thermal expansion CTE1. Inorganic material layer 218 may have a second coefficient of thermal expansion CTE2. Second coefficient of thermal expansion CTE2 may have a difference of less than 100% compared with first coefficient of thermal expansion CTE2. At least one contact via 236 may be formed through inorganic material layer 218. Contact via 236 may contact area 204.

Various embodiments provide a connecting technology, which may require a reduced number of housing processes. According to various embodiments, a wafer, may function as an embedding material, and as a carrier material for back-side thinning of a semiconductor wafer carrying active electrical components. Furthermore, the wafer may also serve as a passivation material which may separate or electrically isolate metallic interconnects from each other. As various embodiments provide a shift away from typical organic encapsulation materials, challenges associated with moisture absorption may be reduced. Good thermal cooling may be achieved, and higher component reliability may be achieved due to the adjusted CTE, e.g. CTE matching between active semiconductor wafer and the encapsulating wafer. Furthermore, many serial processes on the housing level, may be replaced by fewer parallel processes.

Particularly, a semiconductor wafer or component may be encapsulated with an inorganic material, e.g. silicon, at the wafer level. The inorganic material, i.e. the encapsulation medium may be used as a wafer carrier which supports the thinning of the back side. Furthermore, undoped silicon, without ion implanted regions, as an embedding and covering material, e.g. also as a carrier, may allow through contact vias to be formed through the covering material. Therefore, a vertical (last) current flow may be obtained from the front side of an electrical contact at the active wafer and also a vertical signal flow through the encapsulating semiconductor wafer. The encapsulating silicon wafer may be provided with lateral and/or vertical isolation layer and typical wafer processing processes, e.g. thermal oxidation, deposition processes may be used.

Various embodiments provide an integrated circuit including: a carrier including at least one electronic component and at least one contact area disposed on a first side of the carrier, wherein the at least one electronic component is electrically connected to the at least one contact area; an inorganic material layer wafer bonded to the first side of the carrier, wherein the carrier has a first coefficient of thermal expansion, and wherein the inorganic material layer has a second coefficient of thermal expansion, wherein the second coefficient of thermal expansion has a difference of less than 100% compared with the first coefficient of thermal expansion; and at least one contact via formed through the inorganic material layer, wherein the at least one contact via contacts the at least one contact area.

According to an embodiment, the carrier includes a semiconductor wafer.

According to an embodiment, the carrier includes at least one material from the following group of materials, the group of materials consisting of: silicon, gallium arsenide, indium phosphide, gallium nitride and silicon carbide.

According to an embodiment, the second coefficient of thermal expansion is smaller than or about equal to the first coefficient of thermal expansion.

According to an embodiment, the inorganic material layer includes a semiconductor wafer.

According to an embodiment, the inorganic material layer includes at least one material from the following group of materials, the group of materials consisting of: silicon, gallium arsenide, indium phosphide, gallium nitride, glass, aluminum oxide and silicon carbide.

According to an embodiment, the inorganic material layer is formed from the same material as the carrier.

According to an embodiment, the inorganic material layer is directly wafer bonded to the first side of the carrier.

According to an embodiment, the carrier and the inorganic material layer each includes a silicon wafer.

According to an embodiment, the inorganic material has a CTE difference of less than 100% compared with the CTE of the material of the carrier.

According to an embodiment, the inorganic material layer is directly wafer bonded to the first side of the carrier by at least one of fusion bonding, thermocompression bonding, reactive bonding and anodic bonding.

According to an embodiment, the inorganic material layer is wafer bonded to the first side of the carrier by at least one of eutectic bonding, glass frit bonding and adhesive bonding.

According to an embodiment, the inorganic material layer includes a thickness ranging from about 20 μm to 500 μm.

According to an embodiment, the carrier includes a thickness ranging from about 20 μm to 250 μm.

According to an embodiment, at least part of the at least one contact via is formed over the inorganic material layer.

According to an embodiment, the at least one contact via includes an electrically conductive material.

According to an embodiment, the at least one contact via includes an electrically conductive material.

According to an embodiment, the at least one contact via includes at least one material, element or alloy from the following group of materials, the group consisting of: copper, aluminum, silver, tin, gold, palladium, zinc, nickel, iron.

According to an embodiment, the integrated circuit further includes at least one further contact via formed through the inorganic material layer, the at least one further contact via extending between a top side of the inorganic material layer and a second side of the carrier; and the at least one further contact via covers at least part of a further contact area formed on the second side of the carrier.

According to an embodiment, the integrated circuit further includes solder material disposed over the at least one contact via at a top side of the inorganic material layer.

According to an embodiment, the integrated circuit further includes solder material disposed over the at least one contact via and the at least one further contact via at a top side of the inorganic material layer.

Various embodiments provide a chip package including: a semiconductor wafer including at least one electronic circuit and at least one contact pad formed over a wafer first side, wherein the at least one electronic component is electrically connected to the at least one contact pad; a layer having a coefficient of thermal expansion difference of less than 100% compared with a coefficient of thermal expansion of the semiconductor wafer, wherein the layer is wafer bonded to the semiconductor wafer over the at least one contact pad; and at least one electrical interconnect formed through the layer and electrically contacting the at least one contact pad.

According to an embodiment, the semiconductor wafer includes at least one material from the following group of materials, the group of materials consisting of: silicon, gallium arsenide, indium phosphide, gallium nitride and silicon carbide.

According to an embodiment, the layer includes a substrate formed from the same material as the semiconductor wafer.

According to an embodiment, the layer includes at least one material from the following group of materials, the group of materials consisting of: silicon, gallium arsenide, indium phosphide, gallium nitride, glass, aluminum oxide and silicon carbide.

Various embodiments provide a method for manufacturing an integrated circuit, the method including: wafer bonding an inorganic material layer to a first side of a carrier, the carrier including at least one electronic component and at least one contact area disposed on a first side of the carrier, wherein the at least one electronic component is electrically connected to the at least one contact area; and forming at least one contact via through the inorganic material layer, wherein the at least one contact via contacts the at least one contact area.

According to an embodiment, wafer bonding an inorganic material layer to a first side of a carrier includes directly bonding the inorganic material layer to the first side of the carrier.

According to an embodiment, wafer bonding an inorganic material layer to a first side of a carrier includes wafer bonding the inorganic material layer to the first side of the carrier by at least one of anodic bonding, fusion bonding, thermo-compression bonding, reactive bonding eutectic bonding, glass frit bonding and adhesive bonding.

According to an embodiment, wafer bonding an inorganic material layer to a first side of a carrier includes wafer bonding the inorganic material layer including a semiconductor wafer to the first side of the carrier.

According to an embodiment, wafer bonding an inorganic material layer to a first side of a carrier includes wafer bonding an inorganic material layer including at least one of: silicon, gallium arsenide, indium phosphide, gallium nitride, glass, aluminum oxide or silicon carbide to the first side of the carrier.

According to an embodiment, forming at least one contact via through the inorganic material layer includes selectively removing at least one portion of the inorganic material layer to form a channel extending from the at least one contact area to a top side of the inorganic material layer and depositing electrically conductive material in the channel, wherein the electrically conductive material contacts the at least one contact area.

According to an embodiment, the method further includes forming at least one further contact via through the inorganic material layer, the at least one further contact via extending between a top side of the inorganic material layer and a second side of the carrier, the at least one further contact via covering at least part of a further contact area formed on a second side of the carrier.

According to an embodiment, the method further includes disposing solder material over the at least one contact via at the a top side of the inorganic material layer.

According to an embodiment, the carrier has a first coefficient of thermal expansion, and wherein the inorganic material layer has a second coefficient of thermal expansion, wherein the second coefficient of thermal expansion has a difference of less than 100% compared with the first coefficient of thermal expansion.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising: a carrier comprising at least one electronic component and at least one contact area disposed on a first side of the carrier, wherein the at least one electronic component is electrically connected to the at least one contact area; an inorganic material layer wafer bonded to the first side of the carrier, wherein the carrier has a first coefficient of thermal expansion, and wherein the inorganic material layer has a second coefficient of thermal expansion, wherein the second coefficient of thermal expansion has a difference of less than 100% compared with the first coefficient of thermal expansion; and at least one contact via formed through the inorganic material layer, wherein the at least one contact via contacts the at least one contact area,
   wherein the carrier comprises a semiconductor wafer, and wherein the at least one electronic component and at least one contact area disposed on a first side of the semiconductor wafer,
   further comprising an intermediate layer between the inorganic material layer and the first side of the carrier, wherein the intermediate layer includes one material from the following group of materials, the group of materials consisting of: gold, aluminum, and glass frit.

2. The integrated circuit according to claim 1, wherein the carrier comprises at least one material from the following group of materials, the group of materials consisting of: silicon, gallium arsenide, indium phosphide, gallium nitride and silicon carbide.

3. The integrated circuit according to claim 1, wherein the second coefficient of thermal expansion is smaller than or about equal to the first coefficient of thermal expansion.

4. The integrated circuit according to claim 1, wherein the inorganic material layer comprises a semiconductor wafer.

5. The integrated circuit according to claim 1, wherein the inorganic material layer comprises at least one material from the following group of materials, the group of materials consisting of: silicon, gallium arsenide, indium phosphide, gallium nitride, glass, aluminum oxide and silicon carbide.

6. The integrated circuit according to claim 1, wherein the inorganic material layer is formed from the same material as the carrier.

7. The integrated circuit according to claim 1, wherein the inorganic material layer is directly wafer bonded to the first side of the carrier.

8. The integrated circuit according to claim 1, wherein the carrier and the inorganic material layer each comprises a silicon wafer.

9. The integrated circuit according to claim 1, wherein the inorganic material has a CTE difference of less than 100% compared with the CTE of the material of the carrier.

10. The integrated circuit according to claim 1, wherein the inorganic material layer is directly wafer bonded to the first side of the carrier by at least one of fusion bonding, thermocompression bonding, reactive bonding and anodic bonding.

11. The integrated circuit according to claim 1, wherein the inorganic material layer is wafer bonded to the first side of the carrier by at least one of eutectic bonding, glass frit bonding and adhesive bonding.

12. The integrated circuit according to claim 1, wherein the inorganic material layer comprises a thickness ranging from about 20 μm to 500 μm.

13. The integrated circuit according to claim 1, wherein the carrier comprises a thickness ranging from about 20 μm to 250 μm.

14. The integrated circuit according to claim 1, wherein at least part of the at least one contact via is formed over the inorganic material layer.

15. The integrated circuit according to claim 1, wherein the at least one contact via comprises an electrically conductive material.

16. The integrated circuit according to claim 1, wherein the at least one contact via comprises at least one material, element or alloy from the following group of materials, the group consisting of: copper, aluminum, silver, tin, gold, palladium, zinc, nickel, iron.

17. The integrated circuit according to claim 1, further comprising at least one further contact via formed through the inorganic material layer, the at least one further contact via extending between a top side of the inorganic material layer and a second side of the carrier; and wherein the at least one further contact via covers at least part of a further contact area formed on the second side of the carrier.

18. The integrated circuit according to claim 1, further comprising solder material disposed over the at least one contact via at a top side of the inorganic material layer.

19. The integrated circuit according to claim 17, further comprising solder material disposed over the at least one contact via and the at least one further contact via at a top side of the inorganic material layer.

* * * * *